(12) United States Patent
Ho et al.

(10) Patent No.: US 9,899,235 B2
(45) Date of Patent: Feb. 20, 2018

(54) FABRICATION METHOD OF PACKAGING SUBSTRATE

(71) Applicant: Siliconware Precision Industries Co., Ltd., Taichung (TW)

(72) Inventors: Chi-Ching Ho, Taichung (TW); Ying-Chou Tsai, Taichung (TW); Sheng-Che Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/293,858

(22) Filed: Oct. 14, 2016

(65) Prior Publication Data

US 2017/0047230 A1 Feb. 16, 2017

Related U.S. Application Data

(62) Division of application No. 14/104,514, filed on Dec. 12, 2013, now abandoned.

(30) Foreign Application Priority Data

Nov. 27, 2013 (TW) .............................. 102143206 A (51) Int. Cl.
*H01L 21/48* (2006.01)
*H01L 23/00* (2006.01)
(Continued)

(52) U.S. Cl.
CPC ........ *H01L 21/4853* (2013.01); *H01L 21/486* (2013.01); *H01L 21/4857* (2013.01);
(Continued)

(58) Field of Classification Search
CPC .......... H05K 1/115; H05K 1/092; H05K 3/10; H01L 21/4853; H01L 21/4857;
(Continued)

(56) References Cited

U.S. PATENT DOCUMENTS 6,394,819 B1 5/2002 Mosser, III et al.
6,759,319 B2 * 7/2004 Viswanadam .......... H01L 24/11
257/E21.508

(Continued)

*Primary Examiner* — Tucker J Wright
(74) *Attorney, Agent, or Firm* — Mintz Levin Cohn Ferris Glovsky and Popeo, P.C.; Peter F. Corless; Steven M. Jensen (57) ABSTRACT

A packaging substrate is disclosed, which includes: a dielectric layer; a circuit layer embedded in and exposed from a surface of the dielectric layer, wherein the circuit layer has a plurality of conductive pads; and a plurality of conductive bumps formed on the conductive pads and protruding above the surface of the dielectric layer. As such, when an electronic element is disposed on the conductive pads through a plurality of conductive elements, the conductive elements can come into contact with both top and side surfaces of the conductive bumps so as to increase the contact area between the conductive elements and the conductive pads, thereby strengthening the bonding between the conductive elements and the conductive pads and preventing delamination of the conductive elements from the conductive pads.

12 Claims, 8 Drawing Sheets

(51) Int. Cl.

| | |
|---|---|
| *H05K 3/20* | (2006.01) |
| *H05K 3/34* | (2006.01) |
| *H05K 3/40* | (2006.01) |
| *H01L 23/498* | (2006.01) |
| *H01L 21/683* | (2006.01) |
| *H05K 3/06* | (2006.01) |
| *H05K 3/46* | (2006.01) |

(52) U.S. Cl.
CPC .... *H01L 21/6835* (2013.01); *H01L 23/49811* (2013.01); *H01L 23/49822* (2013.01); *H01L 23/49827* (2013.01); *H01L 23/49838* (2013.01); *H01L 23/49866* (2013.01); *H01L 24/16* (2013.01); *H01L 24/81* (2013.01); *H05K 3/064* (2013.01); *H05K 3/205* (2013.01); *H05K 3/3436* (2013.01); *H05K 3/4007* (2013.01); *H05K 3/4038* (2013.01); *H05K 3/4682* (2013.01); *H01L 2221/68345* (2013.01); *H01L 2224/16225* (2013.01); *H01L 2224/16238* (2013.01); *H01L 2224/81193* (2013.01); *H05K 2201/0376* (2013.01); *Y10T 29/49158* (2015.01)

(58) Field of Classification Search
CPC ............... H01L 21/486; H01L 21/6835; H01L 23/49811; H01L 24/16; H01L 24/17; H01L 24/81
See application file for complete search history.

(56) References Cited

U.S. PATENT DOCUMENTS

| | | |
|---|---|---|
| 2004/0156172 A1 | 8/2004 | Lin et al. |
| 2005/0136558 A1 | 6/2005 | Wang et al. |
| 2007/0018088 A1 | 1/2007 | Huang et al. |
| 2008/0251917 A1 | 10/2008 | Chu et al. |

\* cited by examiner

FABRICATION METHOD OF PACKAGING SUBSTRATE

CROSS-REFERENCE TO RELATED APPLICATIONS

This application is a divisional of copending application U.S. Ser. No. 14/104,514, filed on Dec. 12, 2013, which claims under 35 U.S.C. § 119(a) the benefit of Taiwanese Application No. 102143206, filed Nov. 27, 2013, the entire contents of which are incorporated herein by reference.

BACKGROUND OF THE INVENTION

1. Field of the Invention

The present invention relates to packaging substrates, and more particularly, to a packaging substrate and a fabrication method thereof for improving the product reliability.

2. Description of Related Art

Along with the rapid development of electronic industries, electronic products are developed toward the trend of multi-function and high performance. To improve the wiring precision of multi-layer circuit boards, redistribution layer (RDL) technologies have been developed to alternately stack a plurality of dielectric layers and circuit layers on one another and form a plurality of conductive vias in the dielectric layers to electrically connect upper and lower circuit layers. Further, coreless packaging technologies have been developed to meet the miniaturization requirement.

FIGS. 1A to 1F are schematic cross-sectional views showing a method for fabricating a packaging substrate 1 according to the prior art.

Figure 1A:
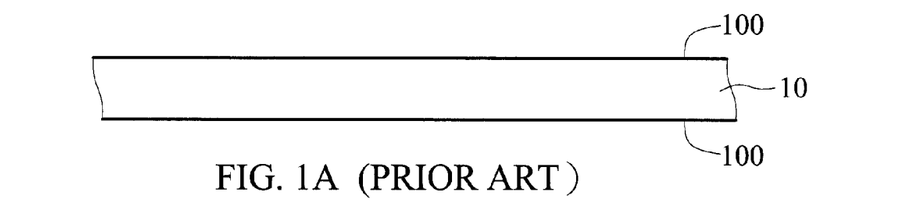
FIGS. 1A to 1F are schematic cross-sectional views showing a method for fabricating a packaging substrate according to the prior art.

Referring to FIG. 1A, a carrier 10 is provided and a conductive layer 100 is formed on upper and lower sides of the carrier 10.

Figure 1B:
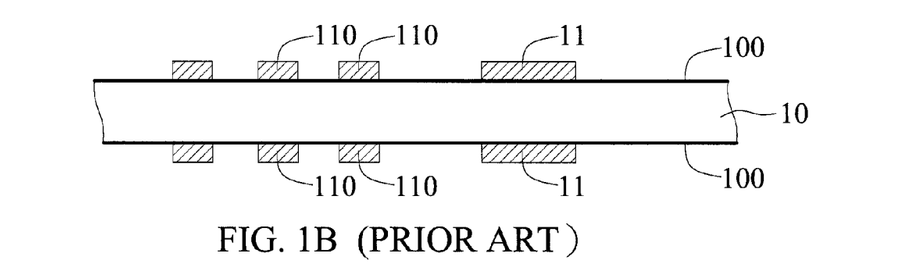

Referring to FIG. 1B, a first circuit layer 11 is formed on the conductive layer 100 by electroplating. The first circuit layer 11 has a plurality of first conductive pads 110.

Figure 1C:
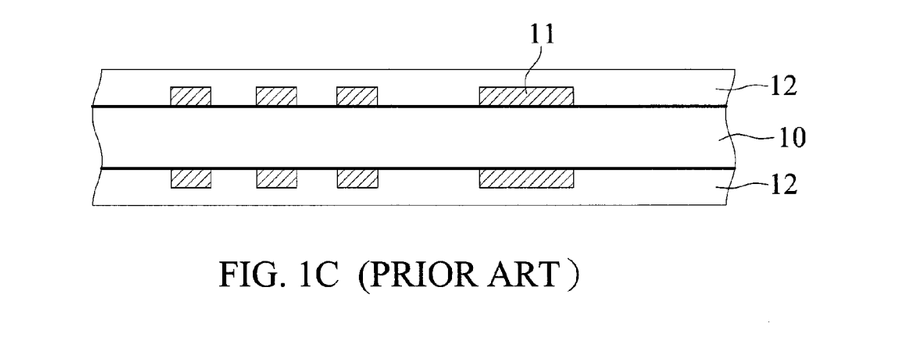

Referring to FIG. 1C, a dielectric layer 12 is formed on the carrier 10 and the first circuit layer 11.

Figure 1D:
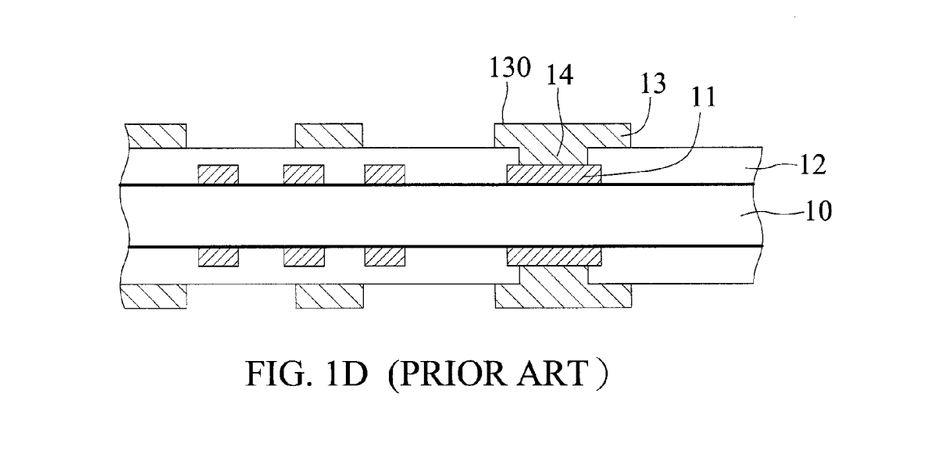

Referring to FIG. 1D, a second circuit layer 13 is formed on the dielectric layer 12. The second circuit layer 13 has a plurality of second conductive pads 130. Further, a plurality of conductive vias 14 are formed in the dielectric layer 12 for electrically connecting the first circuit layer 11 and the second circuit layer 13.

Figure 1E:
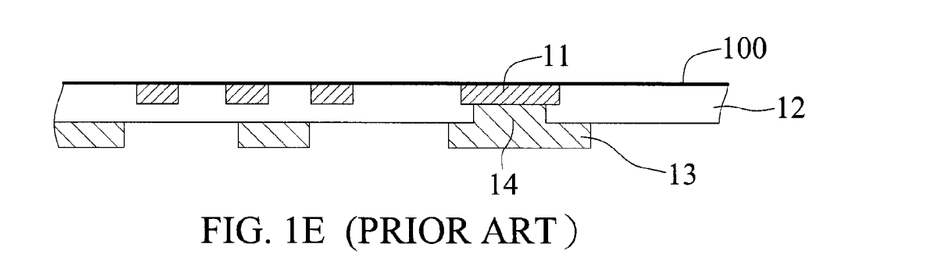

Referring to FIG. 1E, the carrier 10 is removed to expose the conductive layer 100.

Figure 1F:
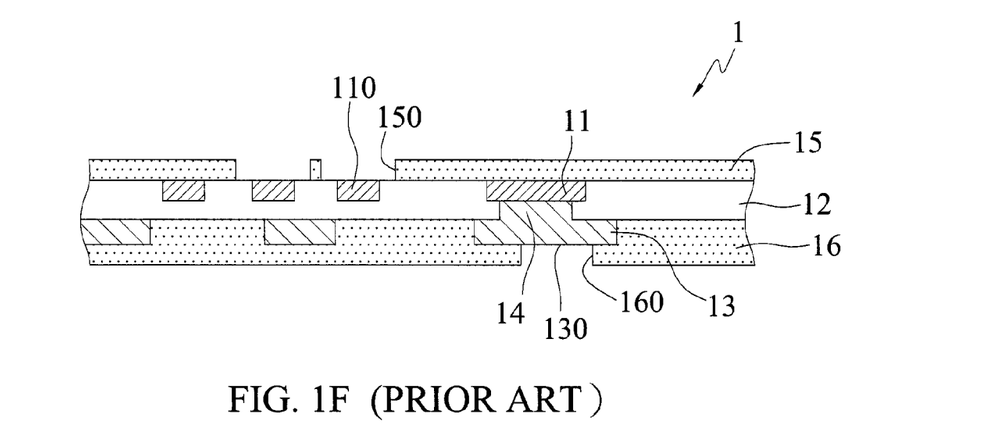

Referring to FIG. 1F, the conductive layer 100 is removed to expose the first circuit layer 11. Then, a first solder mask layer 15 is formed on an upper side of the dielectric layer 12 and the first circuit layer 11 and a plurality of first openings 150 are formed in the first solder mask layer 15 so as to expose the first conductive pads 110 and portions of the dielectric layer 12 around peripheries of the first conductive pads 110, and a second solder mask layer 16 is formed on a lower side of the dielectric layer 12 and the second circuit layer 13 and a plurality of second openings 160 are formed in the second solder mask layer 16 to expose the second conductive pads 130.

Figure 1G:
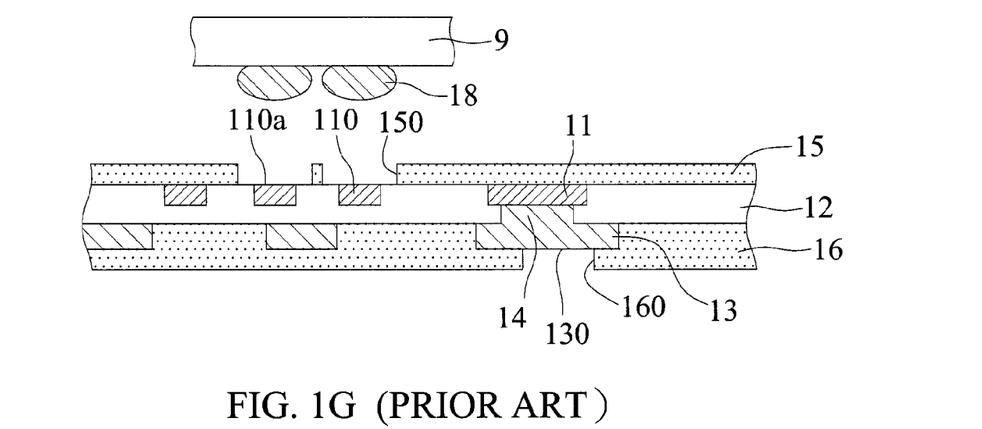
FIG. 1G is a schematic cross-sectional view showing a subsequent process of the conventional packaging substrate.

Subsequently, referring to FIG. 1G, an electronic element 9 is disposed on the first conductive pads 110 through a plurality of conductive elements 18 made of such as a solder material. That is, the conductive elements 18 come into contact with surfaces 110a of the first conductive pads 110. However, such planar contact surfaces lead to small contact area between the conductive elements 18 and the first conductive pads 110, thus adversely affecting the bonding strength between the conductive elements 18 and the first conductive pads 110 and easily causing delamination of the conductive elements 18 from the first conductive pads 110. Therefore, the product reliability is reduced.

In an embodiment, after the carrier 10 is removed, the first circuit layer 11 is etched to have a surface lower than that of the dielectric layer 12. That is, the first circuit layer 11 is recessed into the dielectric layer 12 about 5 um, which however easily causes non-wetting of the conductive elements 18 and consequently causes the conductive elements 18 to be stuck on the surface of the dielectric layer 12 without electrically connecting to the first conductive pads 110.

Therefore, there is a need to provide a packaging substrate and a fabrication method thereof so as to overcome the above-described drawbacks.

SUMMARY OF THE INVENTION

In view of the above-described drawbacks, the present invention provides a packaging substrate, which comprises: a dielectric layer having opposite first and second surfaces; a first circuit layer embedded in the first surface of the dielectric layer and having a surface exposed from the first surface of the dielectric layer, wherein the first circuit layer has a plurality of first conductive pads; and a plurality of conductive bumps formed on the first conductive pads and protruding above the first surface of the dielectric layer.

In the above-described substrate, the conductive bumps can be made of copper.

The present invention further provides a method for fabricating a packaging substrate, which comprises the steps of: providing a carrier having a first circuit layer formed thereon, wherein the first circuit layer has a plurality of first conductive pads; forming a dielectric layer on the carrier and the first circuit layer, wherein the dielectric layer has a first surface in contact with and attached to the carrier and a second surface opposite to the first surface; removing the carrier so as to expose a surface of the first circuit layer from the first surface of the dielectric layer; and forming on the first conductive pads a plurality of conductive bumps protruding above the first surface of the dielectric layer.

In an embodiment, the carrier has a conductive layer that allows the first circuit layer to be formed thereon, and the conductive layer is exposed after removing the carrier such that the step of forming the conductive bumps further comprises: forming a metal layer on the conductive layer; and removing portions of the metal layer and the conductive layer under the metal layer so as for the remaining portions of the metal layer and the conductive layer to form the conductive bumps.

In another embodiment, the carrier has a conductive layer that allows the first circuit layer to be formed thereon, and the conductive layer is exposed after removing the carrier such that the step of forming the conductive bumps further comprises: forming a resist layer on the conductive layer and forming a plurality of openings in the resist layer corresponding in position to the first conductive pads; forming a metal layer in the openings of the resist layer; and removing the resist layer so as for the metal layer to form the conductive bumps.

In a further embodiment, the step of forming the conductive bumps further comprises: forming a metal layer on the first surface of the dielectric layer and the surface of the first circuit layer; and removing portions of the metal layer so as for the remaining portions of the metal layer to form the conductive bumps.

In still another embodiment, the surface of the carrier has a metal layer, and after the carrier is removed, portions of the metal layer are removed so as for the remaining portions of the metal layer to form the conductive bumps.

In the above-described substrate and method, the conductive bumps can be less, equal to or greater in width than the first conductive pads.

In the above-described substrate and method, the surface of the first circuit layer can be flush with or lower than the first surface of the dielectric layer.

In the above-described substrate and method, an insulating layer can be formed on the first surface of the dielectric layer and the surface of the first circuit layer and have a plurality of openings for exposing the conductive bumps.

In the above-described substrate and method, a second circuit layer can be formed on the second surface of the dielectric layer. Further, a plurality of conductive vias can be formed in the dielectric layer for electrically connecting the first circuit layer and the second circuit layer. Furthermore, an insulating layer can be formed on the second surface of the dielectric layer and the second circuit layer and have a plurality of openings for exposing portions of the second circuit layer.

According to the present invention, when an electronic element is disposed on the first conductive pads through a plurality of conductive elements, the conductive elements can come into contact with both top and side surfaces of the conductive bumps so as to increase the contact area between the conductive elements and the first conductive pads, thereby strengthening the bonding between the conductive elements and the first conductive pads and preventing delamination of the conductive elements from the first conductive pads.

Further, even if the surface of the first circuit layer is lower than the first surface of the dielectric layer, the conductive bumps protruding above the first surface of the dielectric layer ensure sufficient wetting of the conductive elements so as to prevent the conductive elements from being stuck on the first surface of the dielectric layer as in the prior art. Therefore, the conductive elements can be in effective contact with the conductive bumps so as to be electrically connected to the first conductive pads.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "first", "second", "a" etc. are merely for illustrative purposes and should not be construed to limit the scope of the present invention.

FIGS. 2A to 2G are schematic cross-sectional views showing a method for fabricating a packaging substrate 2 according to the present invention.

Figure 2A:
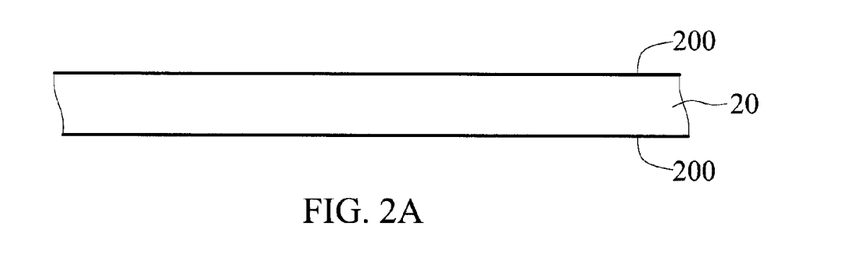
FIGS. 2A to 2G' are schematic cross-sectional views showing a method for fabricating a packaging substrate according to the present invention, wherein FIGS. 2F' and 2F" show other embodiments of the FIG. 2F, and FIG. 2G' shows another embodiment of FIG. 2G.
Figure 2B:
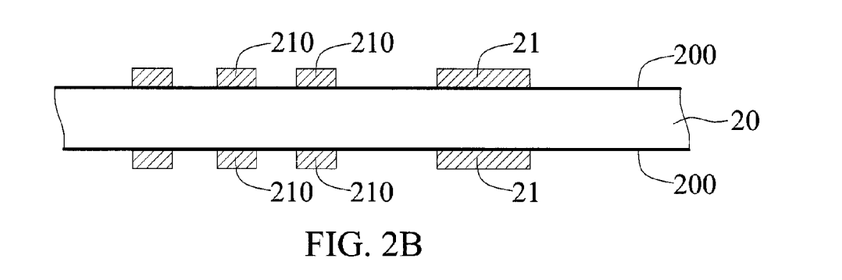

Referring to FIGS. 2A and 2B, a carrier 20 is provided and a first circuit layer 21 is formed on upper and lower surfaces of the carrier 20.

The carrier 20 can be an insulating plate, a ceramic plate, a copper clad laminate or a glass plate. In the present embodiment, a metal layer 200 is formed on the upper and lower surfaces of the carrier 20 to serve as a conductive layer, i.e., a seed layer. If the carrier 20 is a copper clad laminate, the copper foil of the copper clad laminate can serve as the conductive layer.

Referring to FIG. 2B, a first circuit layer 21 is formed on the conductive layer 200 by electroplating. The first circuit layer 21 has a plurality of first conductive pads 210.

Figure 2C:
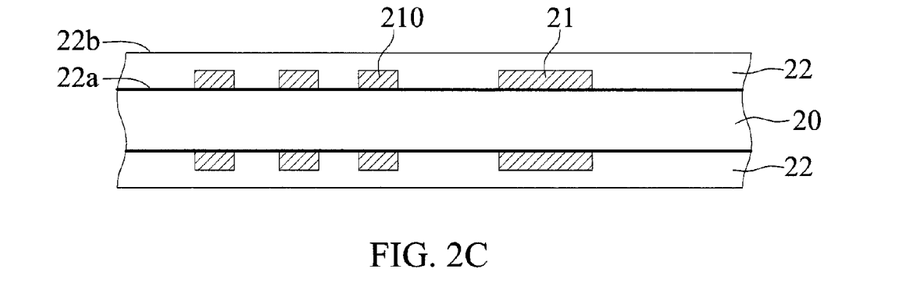

Referring to FIG. 2C, a dielectric layer 22 is formed on the carrier 20 and the first circuit layer 21. The dielectric layer 22 has a first surface 22a in contact with and attached to the carrier 20 and a second surface 22b opposite to the first surface 22a.

In the present embodiment, the dielectric layer 22 is made of prepreg.

Figure 2D:
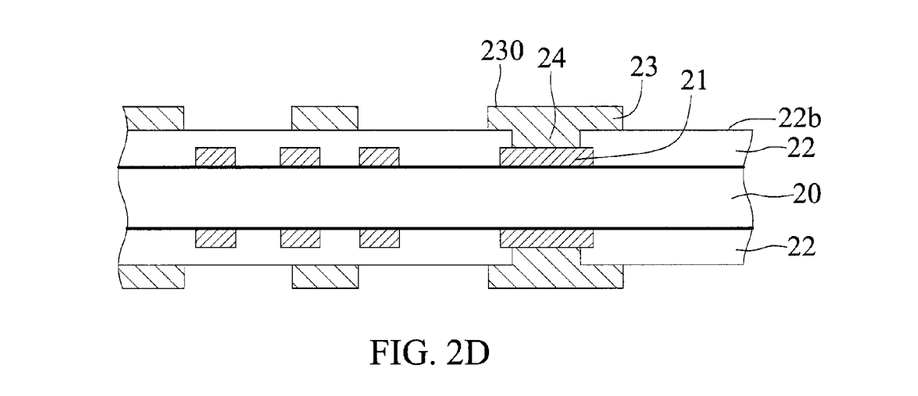

Referring to FIG. 2D, a second circuit layer 23 is formed on the second surface 22b of the dielectric layer 22. The second circuit layer 23 has a plurality of second conductive pads 230. Further, a plurality of conductive vias 24 are formed in the dielectric layer 22 for electrically connecting the first circuit layer 21 and the second circuit layer 23.

Figure 2E:
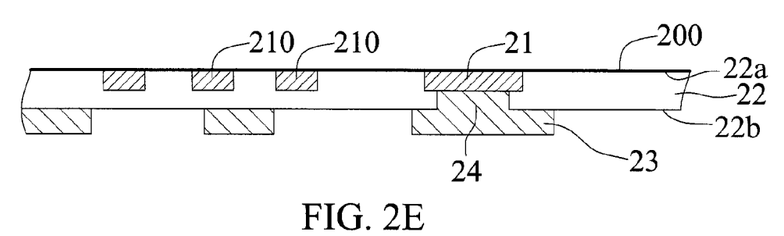

Referring to FIG. 2E, the carrier 20 is removed to expose the conductive layer 200.

Figure 2F:
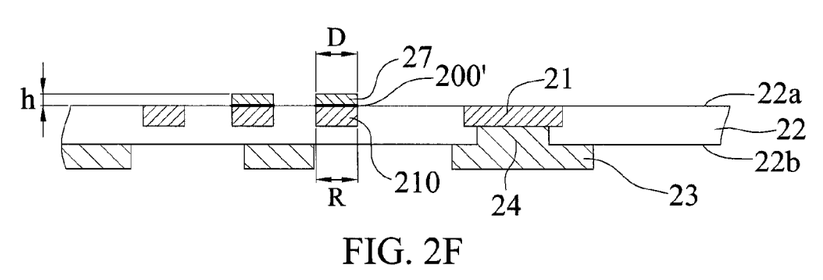

Referring to FIG. 2F, a plurality of conductive bumps 27 made of such as copper are formed on the conductive layer 200 corresponding in position to the first conductive pads 210. The conductive bumps 27 protrude to a height h of 5 um above the first surface 22a of the dielectric layer 22. Then, portions of the conductive layer 200 exposed from the conductive bumps 27 are removed while maintaining portions 200' of the conductive layer 200 under the conductive bumps 27.

In the present embodiment, the width D of the conductive bumps 27 is equal to the width R of the first conductive pads 210.

In another embodiment, referring to FIG. 2F', the width D' of the conductive bumps 27' is greater than the width R of the first conductive pads 210. In a further embodiment, referring to FIG. 2F", the width D" of the conductive bumps 27' is less than the width R of the first conductive pads 210.

Figure 2G:
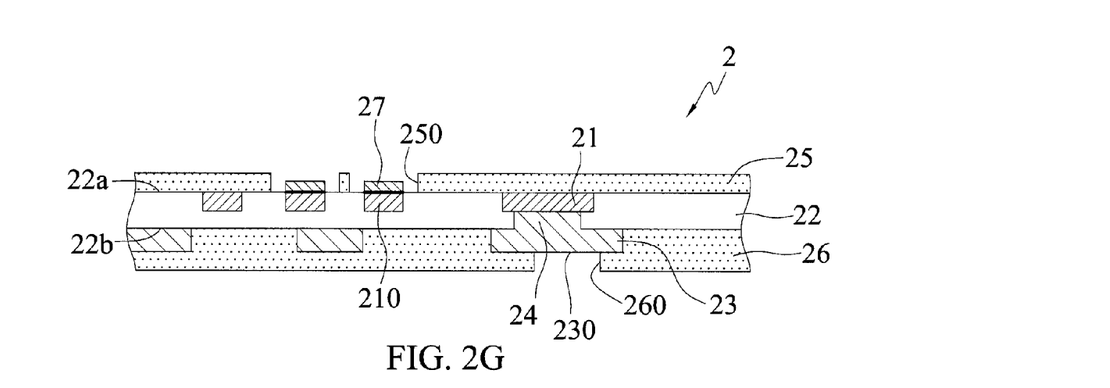

Referring to FIG. 2G, a first insulating layer 25 is formed on the first surface 22a of the dielectric layer 22 and the first circuit layer 21 and a plurality of first openings 250 are formed in the first insulating layer 25 so as to expose the conductive bumps 27 and portions of the first surface 22a of the dielectric layer 22 around peripheries of the conductive bumps 27. Further, a second insulating layer 26 is formed on the second surface 22b of the dielectric layer 22 and the second circuit layer 23 and a plurality of second openings 260 are formed in the second insulating layer 26 to expose the second conductive pads 230.

In another embodiment, referring to FIG. 2G', when the conductive layer 200 is removed, the first conductive pads 210 are also partially removed so as to be recessed into the first surface 22a of the dielectric layer 22.

Figure 2H:
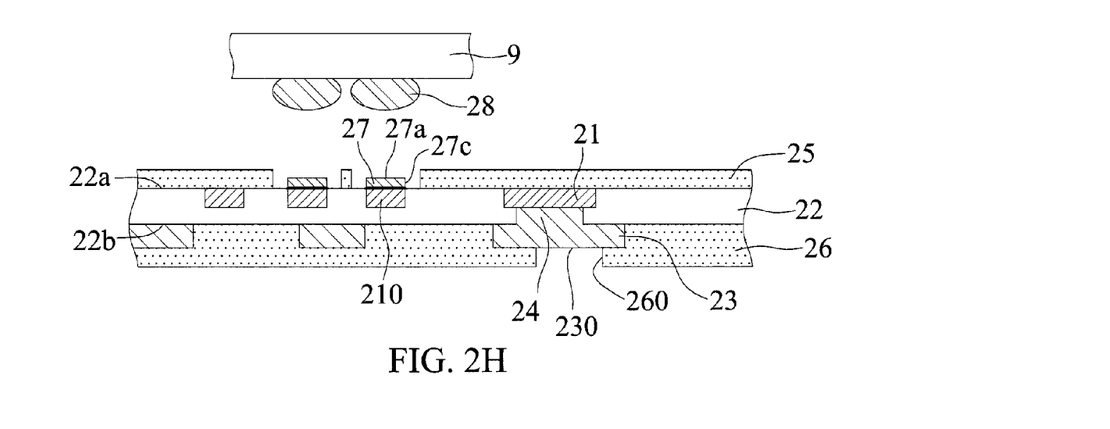
FIG. 2H is a schematic cross-sectional view showing a subsequent process of the packaging substrate of the present invention.

Subsequently, referring to FIG. 2H, an electronic element 9 is disposed on the first conductive pads 210 through a plurality of conductive elements 28 made of such as a solder material. Since the conductive bumps 27 protrude above the first surface 22a of the dielectric layer 22, the conductive elements 28 can come into contact with both top surfaces 27a and side surfaces 27c of the conductive bumps 27 so as to increase the contact area between the conductive elements 28 and the first conductive pads 210, thereby strengthening the bonding between the conductive elements 28 and the first conductive pads 210 and preventing delamination of the conductive elements 28 from the first conductive pads 210. Therefore, the product reliability is improved.

Further, even if the surface of the first circuit layer 21 is lower than the first surface 22a of the dielectric layer 22, the conductive bumps 27 protruding above the first surface 22a of the dielectric layer 22 ensure sufficient wetting of the conductive elements 28 so as to prevent the conductive elements 28 from being stuck on the first surface 22a of the dielectric layer 22. Therefore, the conductive elements 28 can be in effective contact with the conductive bumps 27 so as to be electrically connected to the first conductive pads 210.

The conductive bumps 27 can be formed through the following methods.

Figure 3A:
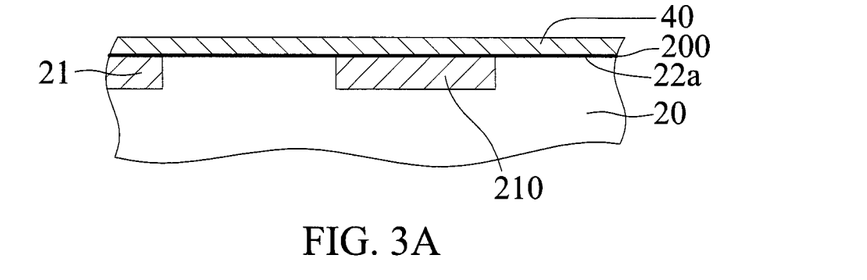
FIGS. 3A and 3B are schematic cross-sectional views showing a method for forming the conductive bumps of FIG. 2F.
Figure 3B:
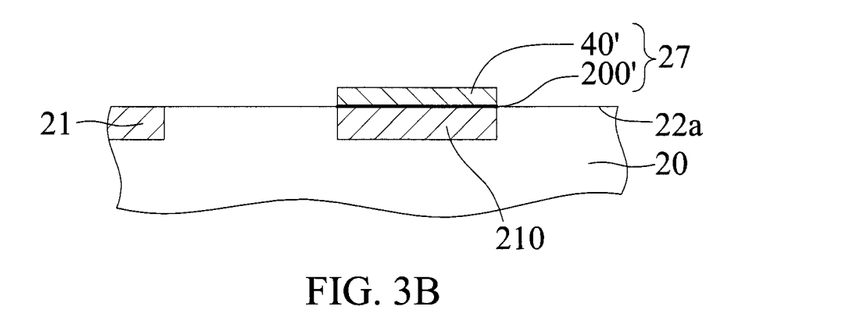

FIGS. 3A and 3B are schematic cross-sectional views showing a method for forming the conductive bumps 27 according to a first embodiment.

Referring to FIG. 3A, a metal layer 40 is formed on the conductive layer 200 by attaching or electroplating.

In the present embodiment, the conductive layer 200 is a copper foil.

Referring to FIG. 3B, a patterning process is performed to remove portions of the metal layer 40 and the conductive layer 200 under the metal layer 40. As such, the remaining portions 40' of the metal layer 40 and the remaining portions 200' of the conductive layer 200 form the conductive bumps 27.

Figure 4A:
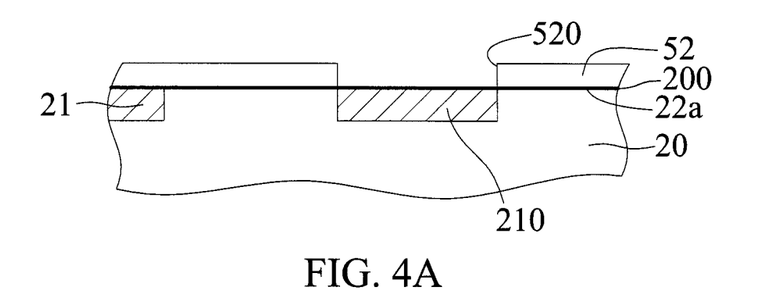
FIGS. 4A to 4C are schematic cross-sectional views showing another method for forming the conductive bumps of FIG. 2F.
Figure 4B:
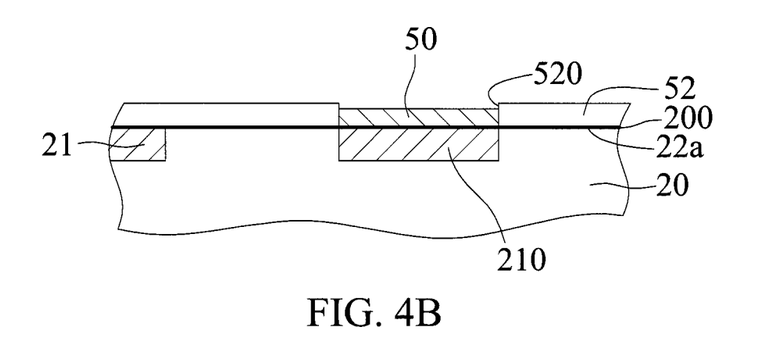
Figure 4C:
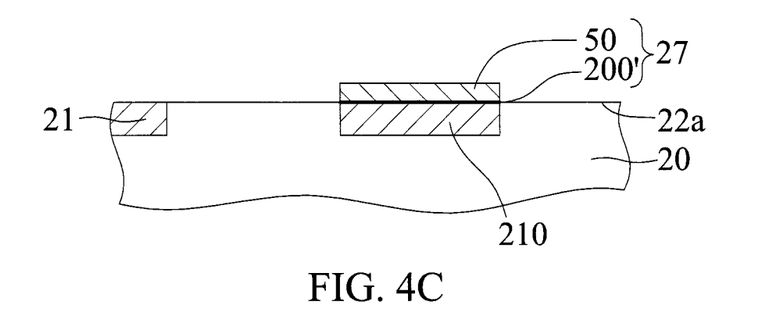

FIGS. 4A to 4C are schematic cross-sectional views showing a method for forming the conductive bumps 27 according to a second embodiment.

Referring to FIG. 4A, a resist layer 52 is formed on the conductive layer 200 and a plurality of third openings 520 are formed in the resist layer 52 to expose portions of the conductive layer 200 corresponding in position to the first conductive pads 210.

In the present embodiment, the conductive layer 200 is a copper foil.

Referring to FIG. 4B, a metal layer 50 is formed on the exposed portions of the conductive layer 200 in the third openings 520 of the resist layer 52 by electroplating.

Referring to FIG. 4C, the resist layer 52 and the portions of the conductive layer 200 under the resist layer 52 are removed. As such, the metal layer 50 and the portions 200' of the conductive layer 200 under the metal layer 50 form the conductive bumps 27.

Figure 5A:
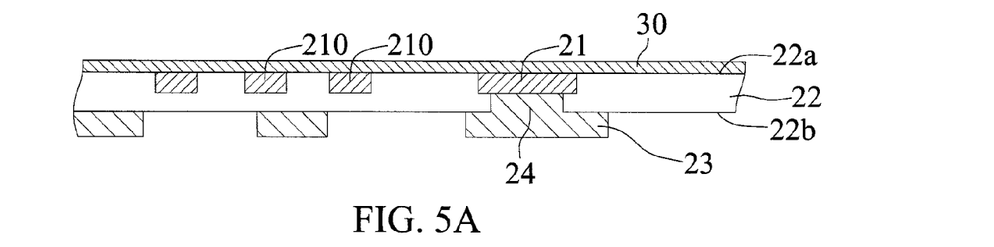
FIGS. 5A and 5B are schematic cross-sectional views showing a further method for forming the conductive bumps of FIG. 2F.
Figure 5B:
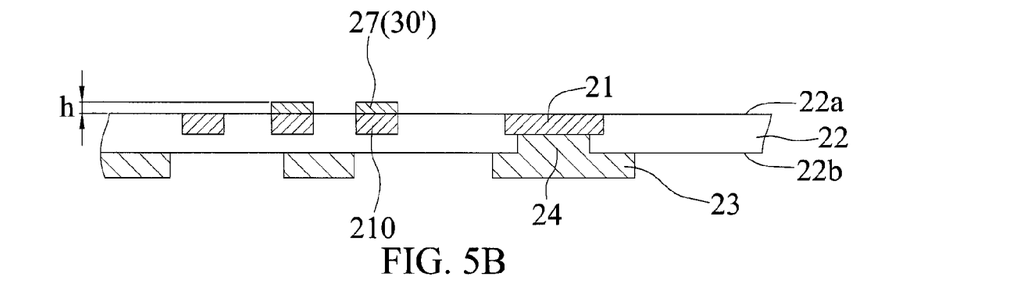

FIGS. 5A and 5B are schematic cross-sectional views showing a method for forming the conductive bumps 27 according to a third embodiment.

Referring to FIG. 5A, the conductive layer 200 is removed and a metal layer 30 is formed on the first surface 22a of the dielectric layer 22 and the first circuit layer 21.

In the present embodiment, a copper foil can be laminated on the first surface 22a of the dielectric layer 22 and the first circuit layer 21 to serve as the metal layer 30. Alternatively, the metal layer 30 can be formed by electroplating.

In other embodiments, after the conductive layer 200 is removed, the first circuit layer 21 has a surface slightly lower than the first surface 22a of the dielectric layer 22 so as to be recessed into the first surface 22a of the dielectric layer 22.

In another embodiment, no conductive layer 200 is formed on the upper and lower surfaces of the carrier 20. Instead, referring to FIG. 5A, the metal layer 30 is directly formed on the upper and lower surfaces of the carrier 20. Therefore, after the carrier 20 is removed, the metal layer 30 is exposed.

Referring to FIG. 5B, a patterning process is performed to remove portions of the metal layer 30. As such, the remaining portions 30' of the metal layer 30 form the conductive bumps 27.

The present invention further provides a packaging substrate 2, which has: a dielectric layer 22 having opposite first and second surfaces 22a, 22b; a first circuit layer 21 embedded in the first surface 22a of the dielectric layer 22 and having a surface exposed from the first surface 22a of the dielectric layer 22, wherein the first circuit layer 21 has a plurality of first conductive pads 210; and a plurality of conductive bumps 27, 27', 27" formed on the first conductive pads 210 and protruding above the first surface 22a of the dielectric layer 22.

The surface of the first circuit layer 21 can be flush with the first surface 22a of the dielectric layer 22.

The conductive bumps 27, 27', 27" can be less, equal to or greater in width than the first conductive pads 210. The conductive bumps 27, 27', 27" can be made of copper.

The packaging substrate 2 can further have a first insulating layer 25 formed on the first surface 22a of the dielectric layer 22 and the surface of the first circuit layer 21 and having a plurality of openings 250 for exposing the conductive bumps 27, 27', 27" and portions of the first surface 22a around peripheries of the conductive bumps 27, 27', 27".

The packaging substrate 2 can further have a second circuit layer 23 formed on the second surface 22b of the dielectric layer 22 and having a plurality of second conductive pads 230. Further, a plurality of conductive vias 24 are formed in the dielectric layer 22 for electrically connecting the first circuit layer 21 and the second circuit layer 23. Furthermore, the packaging substrate 2 can have a second insulating layer 26 formed on the second surface 22b of the dielectric layer 22 and the second circuit layer 23 and having a plurality of second openings 260 for exposing the second conductive pads 230.

According to the present invention, since the first conductive pads have the conductive bumps formed thereon and protruding above the first surface of the dielectric layer, when an electronic element is disposed on the first conductive pads through a plurality of conductive elements made of such as a solder material, the conductive elements can come into contact with a plurality of surfaces of the conductive bumps so as to increase the contact area between the conductive elements and the first conductive pads, thereby strengthening the bonding between the conductive elements and the first conductive pads and preventing delamination of the conductive elements from the first conductive pads. Therefore, the product reliability is improved.

Further, even if the surface of the first circuit layer is lower than the first surface of the dielectric layer, the conductive bumps protruding above the first surface of the dielectric layer ensure sufficient wetting of the conductive elements so as to cause the conductive elements to be in effective contact with the conductive bumps so as to be electrically connected to the first conductive pads, thereby improving the product reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a packaging substrate, comprising the steps of:
   providing a carrier having a first circuit layer formed thereon, wherein the carrier has a conductive layer that allows the first circuit layer to be formed thereon, and the first circuit layer has a plurality of first conductive pads;
   forming a dielectric layer on the carrier and the first circuit layer, wherein the dielectric layer has a first surface in contact with and attached to the carrier and a second surface opposite to the first surface;
   removing the carrier so as to expose a surface of the conductive layer formed on the first circuit layer from the first surface of the dielectric layer;
   forming a resist layer on the conductive layer and forming a plurality of openings in the resist layer corresponding in position to the first conductive pads;
   forming a metal layer in the openings of the resist layer; and
   removing the resist layer so as for the metal layer to form on the first conductive pads a plurality of conductive bumps protruding above the first surface of the dielectric layer.

2. The method of claim 1, wherein the surface of the first circuit layer is flush with or lower than the first surface of the dielectric layer.

3. The method of claim 1, further comprising forming an insulating layer on the first surface of the dielectric layer and the surface of the first circuit layer and forming a plurality of openings in the insulating layer for exposing the conductive bumps.

4. The method of claim 1, further comprising forming a second circuit layer on the second surface of the dielectric layer.

5. The method of claim 4, further comprising forming a plurality of conductive vias in the dielectric layer for electrically connecting the first circuit layer and the second circuit layer.

6. The method of claim 4, further comprising forming an insulating layer on the second surface of the dielectric layer and the second circuit layer and forming a plurality of openings in the insulating layer for exposing portions of the second circuit layer.

7. A method for fabricating a packaging substrate, comprising the steps of:
   providing a carrier having a first circuit layer formed thereon, wherein the carrier has a metal layer, and the first circuit layer has a plurality of first conductive pads;
   forming a dielectric layer on the carrier and the first circuit layer, wherein the dielectric layer has a first surface in contact with and attached to the carrier and a second surface opposite to the first surface;
   removing the carrier so as to expose a surface of the first circuit layer from the first surface of the dielectric layer; and
   after the carrier is removed, portions of the metal layer are removed so as for the remaining portions of the metal layer to form on the first conductive pads a plurality of conductive bumps protruding above the first surface of the dielectric layer.

8. The method of claim 7, wherein the surface of the first circuit layer is flush with or lower than the first surface of the dielectric layer.

9. The method of claim 7, further comprising forming an insulating layer on the first surface of the dielectric layer and the surface of the first circuit layer and forming a plurality of openings in the insulating layer for exposing the conductive bumps.

10. The method of claim 7, further comprising forming a second circuit layer on the second surface of the dielectric layer.

11. The method of claim 10, further comprising forming a plurality of conductive vias in the dielectric layer for electrically connecting the first circuit layer and the second circuit layer.

12. The method of claim 10, further comprising forming an insulating layer on the second surface of the dielectric layer and the second circuit layer and forming a plurality of openings in the insulating layer for exposing portions of the second circuit layer.

* * * * *